United States Patent [19]
Hawkins et al.

[11] Patent Number: 5,719,075
[45] Date of Patent: Feb. 17, 1998

[54] METHOD OF MAKING A PLANAR CHARGE COUPLED DEVICE WITH EDGE ALIGNED IMPLANTS AND ELECTRODES CONNECTED WITH OVERLYING METAL

[75] Inventors: Gilbert Allan Hawkins, Mendon; Robert Leroy Nielsen, Pittsford, both of N.Y.

[73] Assignee: Eastman Kodak Company, Rochester, N.Y.

[21] Appl. No.: 556,551

[22] Filed: Nov. 13, 1995

[51] Int. Cl.$^6$ .............. H01L 21/70; H01L 27/00
[52] U.S. Cl. .............................. 438/75; 438/144
[58] Field of Search ..................... 437/2, 3, 50, 53

[56] References Cited

U.S. PATENT DOCUMENTS

| | | |
|---|---|---|
| 3,651,349 | 3/1972 | Kahng et al. . |
| 3,700,932 | 10/1972 | Kahng . |
| 3,789,267 | 1/1974 | Krambeck et al. . |
| 3,911,560 | 10/1975 | Amelio et al. . |
| 3,927,468 | 12/1975 | Anthony et al. . |
| 4,035,906 | 7/1977 | Tasch et al. . |
| 4,047,215 | 9/1977 | Frye et al. . |
| 4,167,017 | 9/1979 | Tasch, Jr. et al. . |
| 4,229,752 | 10/1980 | Hyneck . |
| 4,613,402 | 9/1986 | Losee et al. . |
| 4,746,622 | 5/1988 | Hawkins et al. . |
| 4,766,089 | 8/1988 | Davids et al. ............ 437/53 |
| 4,789,648 | 12/1988 | Chow et al. . |
| 4,954,142 | 9/1990 | Carr et al. . |
| 4,992,392 | 2/1991 | Nichols et al. . |
| 4,994,405 | 2/1991 | Jaykar ....................... 437/53 |
| 5,330,924 | 7/1994 | Huang et al. ............. 437/50 |
| 5,399,888 | 3/1995 | Nakashiba . |

OTHER PUBLICATIONS

Banghart et al, Charge Transfer in the Presence of Potential Barriers, Compel Int. Jour. for Computation & Mathematics, vol. 10, No. 4, pp. 205–213 (1991).

Nobusada et al, A Frame Interline Transfer CCD Image Sensor, ISSCC Digest of Technical Papers, pp. 88–89, Feb. 1989.

*Primary Examiner*—Brian Dutton
*Attorney, Agent, or Firm*—Raymond L. Owens

[57] ABSTRACT

A method of making a fully self-aligned, planar, two phase charge coupled device comprises the steps of first forming upon a semiconductive substrate a uniform dielectric; then implanting ions of a second conductivity type into the substrate, then patterning closely spaced first conductive strips of a first conductive layer on the dielectric, then further implanting ions of the first or second conductivity type in the regions between said first conductive strips, then depositing uniformly a second conductive layer electrically isolated from the first conductive strips by an insulative region, then entirely removing by uniform planarization those portions of the second conductive layer disposed over regions of the first conductive strips so as to form coplanar, alternating first and thick electrically isolated conductive strips, then depositing a second insulative layer, then electrically connecting selected adjacent first and second conductive strips together to form first and second composite gate electrodes, then further connecting selected composite gate electrodes together with a planar metallic conductor.

15 Claims, 8 Drawing Sheets

METHOD OF MAKING A PLANAR CHARGE COUPLED DEVICE WITH EDGE ALIGNED IMPLANTS AND ELECTRODES CONNECTED WITH OVERLYING METAL

CROSS REFERENCE TO RELATED APPLICATIONS

Reference is made to commonly assigned U.S. application Ser. No. 08/376,699, filed Jan. 23, 1995, entitled "Method of Making a Planar Charge Coupled Device With Edge Aligned Implants and Interconnected Electrodes by Hawkins et al and Ser. No. 08/376,994, filed Jan. 23, 1995, entitled "Method of Making a Confined Planar Charge Coupled Device with Edge Aligned Implants and Interconnected Electrodes" by Hawkins et al, the disclosures of which are incorporated herein by reference.

FIELD OF THE INVENTION

This invention relates to a method of making a two phase charge coupled device in which ion implants and gate electrodes are self-aligned and in which selected adjacent gate electrodes are connected electrically together with alternate pairs of connected electrodes contacting an overlying planar metallic conductive material.

BACKGROUND OF THE INVENTION

Charge coupled devices (hereinafter also referred to as CCDs) have found wide acceptance as shift registers for transporting charge in semiconductive substrates. A series of laterally spaced gate electrodes adjacent to but conductively separated from the semiconductive substrate and from one another are relied upon to transport minority carrier charge in discrete transfer steps within the semiconductive substrate. Each charge transfer step is achieved by proper potential biasing of the gate electrodes so that charge is attracted from one charge storage region to a next adjacent charge storage region in the semiconductive substrate.

It is essential that charge transfer be complete (high charge transfer efficiency) due to the large number, typically a thousand, of charge transfers employed in device operation. It is also desirable to run the CCDs at high speed, especially when a large number of pixels must be read out in a fixed interval. The combination of good transfer efficiency and high clocking speed has been especially difficult to achieve. In addition, it is desirable in interline devices that unwanted light be kept from penetrating the CCD shift registers.

Three phase CCDs, such as those described in Kahng et al., U.S. Pat. No. 3,700,932, are among the simplest to construct. The potential well in the substrate is uniform under each electrode and is controlled by the potential applied to the corresponding electrode. Charge transfer efficiency in three phase CCDs can be high because the potential in the semiconductive substrate varies monotonically from its value in the region under one electrode to that under an adjacent electrode when the two electrodes are biased for charge transfer, as is well known in the art. While three phase CCDs are simple in construction, the three phase clocking required for charge transport has been regarded as disadvantageous. Also, the topography of a three phase device is disadvantageous particularly for interline sensors. The art has sought to construct a CCD capable of being driven by a two phase clock, in which case the CCD must be modified in construction to directionally bias charge transfer. An early two phase CCD, such as described in Kahng et al., U.S. Pat. No. 3,651,349, relied upon an insulator of stepped thickness under a single gate electrode to accomplish this modification, the step creating a region of lesser potential depth in the semiconductive substrate where the insulator was thinner and a region of greater potential depth where the insulator was thicker. Although the charge transfer efficiency of this device was high, the non-uniformity of the insulative layer was cumbersome to construct and required portions of the gate electrodes to lie in different planes, increasing topography.

Figure 1:
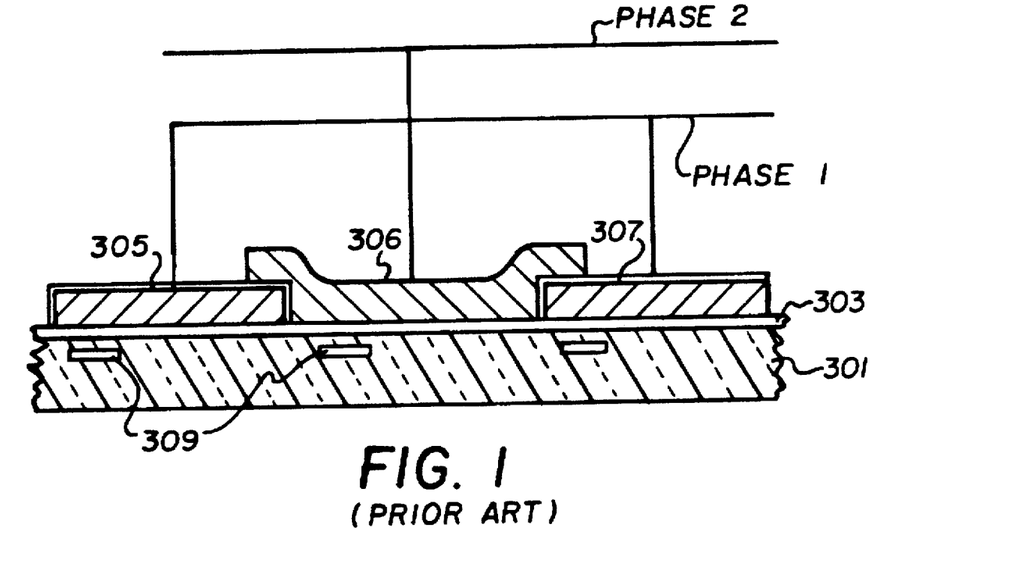
FIG. 1 is a fragmentary, partially schematic vertical section view through a semiconductor device, illustrating a prior art construction.

The art has therefore shown a preference for two phase CCDs having a simpler insulative layer. A gate electrode construction relying on regions of increased impurity dopant concentration in the semiconductive substrate for directional biasing of charge transfer is illustrated by Krambeck, U.S. Pat. No. 3,789,267. Such CCDs are illustrated by FIG. 1 in which a semiconductive substrate 301 of a first conductivity type supports an insulative layer 303 on which interlaid sets of gate electrodes 305, 306, and 307 connected to the phase 1 and phase 2 power sources as shown are positioned. As shown, regions 309, formed by ion implantation in the semiconductive substrate, exhibit a different net level of impurity doping than the surrounding portions of the semiconductive substrate. The regions can be of the first conductivity type as taught in U.S. Pat. No. 3,789,267 or can alternatively be of a second conductivity type, as taught by Tasch et at. in U.S. Pat. No. 4,035,906. It is particularly preferred that such implants be of a species such as arsenic which diffuses slowly in the semiconductive substrate, because thermal diffusion of dopants produces potential "wells" or potential "barriers" which trap charge during transfer, as is well known in the art. It is also preferred that such implants be accomplished at the lowest possible energies to reduce lateral spread or straggle of the dopant due to scattering of energetic dopant ions from the atoms in the substrate.

While the methods taught by U.S. Pat. Nos. 3,789,267 and 4,035,906 allow the use of low energy implants and of arsenic implants in particular, the implants and the gates are located with respect to one another by benchmarks not identified and are not self-aligned, as illustrated for a typical misalignment in FIG. 1. The art has encountered difficulty constructing two phase CCDs with such impurity regions not self-aligned to the gates, because misalignment in either direction produces potential "wells" or potential "barriers" which trap charge during transfer, especially transfer at high speeds, as is well known in the art, discussed for example by Banghart et at. in COMPEL—The International Journal for Computation and Mathematics in Electrical and Electronic Engineering, Vol. 10, No. 4, 205–213, 1991. In addition, the methods taught by U.S. Pat. Nos. 3,789,267 and 4,035,906 suffer increased topography as practiced, due to the overlap of electrodes, generally not desirable in semiconductor processing.

Virtual phase CCDs, as taught by Frye et al. in U.S. Pat. No. 4,047,215, Nichols et al. in U.S. Pat. No. 4,992,392, and by Hynecek in U.S. Pat. No. 4,229,752, have been employed to substantially accomplish self-alignment of the potential in the semiconductive substrate due to a direction biasing implant under the clocked electrode and to eliminate electrode overlap. In this technology, one set of physical electrodes is replaced by a heavily doped region near the surface of the semiconductive substrate. Such virtual phase electrodes are used to uniformly fix or pin the surface potential in a manner self-aligned to the adjacent physical gate electrode and to negate the effect of misalignment of direction biasing implants under the physical electrode. In addition to accomplishing self-alignment of implant and electrode, this technology also allows a large fraction of incident light to pass directly into the semiconductor substrate, and the absence of a second conductive electrode improves the device topography. However, the amount of charge that can be transferred in virtual phase CCDs is limited due to the inability to clock the potential of the pinned region. Also, the process taught by U.S. Pat. No. 4,229,752 requires diffusion of the implanted dopant out of an insulative material, a process difficult to control and producing lateral spreading of implant profiles, an effect also well known in the art to itself produce "wells" and "barriers" to charge transfer particularly at high speed. Such diffusion out of an insulative material is also required by a similar method of fabrication of two phase CCDs taught by Tasch et al. in U.S. Pat. No. 4,167,017. These devices also suffer from non-planar topography.

Anthony et al. in U.S. Pat. No. 3,927,468, Losee et al. in U.S. Pat. No. 4,613,402, and Hawkins et al. in U.S. Pat. No. 4,746,622 disclose methods of fabricating self-aligned two phase CCDs in which the charge transfer direction biasing implants are fully self-aligned to phase 1 and phase 2 electrodes, both of which can be clocked independently. Although the implants taught are self-aligned, CCDs fabricated by these method suffer some degree of implant induced potential "wells" and potential "barriers" due to the inherent necessity in these methods of implanting at least one direction biasing implant through the gate electrode. This implantation procedure requires a higher energy implantation in comparison to implantation through the insulative layer alone or directly into the semiconductive substrate which is well known in the art to result in lateral spreading or straggle of the implant in the semiconductive substrate, such straggle in turn inducing potential "wells" and "barriers", also known in the art. Again, the regions of overlap of the electrodes introduce process dependent variability in the amount of light passed as well as well as additional topography.

Amelio et at., in U.S. Pat. No. 3,911,560, teaches a method to construct self-aligned two phase CCDs in which the charge transfer direction biasing implants are fully self-aligned to electrode phases, both of which are clocked, and which does not require implantation of a charge transfer direction biasing implant to be through a gate electrode. Therefore, this method in principal avoids the occurrence of potential "wells" and "barriers" as well as enabling all phases to be clocked. Because the implants are made directly into the substrate or through only a thin dielectric layer, lateral spread of the implanted species is restricted and slowly diffusing dopants such as arsenic may be employed, additionally avoiding the occurrence of potential "wells" and "barriers". However, the fabrication steps of connecting two adjacent gate electrodes electrically to form a single gate electrode, as taught by U.S. Pat. No. 3,911,560, are cumbersome and require relatively large amounts of space, and device topography is greatly increased. It is particularly difficult to provide small devices whose storage regions alone are implanted in a self aligned manner, because the wider of the electrode strips must be deposited first, in order to accommodate the overlapping structure of the second conductive electrode strips. Thus the implant which is self-aligned occurs preferably under the second phase, or smaller of the electrode strips, and is thereby associated with the transfer region.

Although the device taught in U.S. Pat. No. 3,911,560 does not suffer from implantation misalignment, high speed charge transfer efficiency is limited for large numbers of pixels by the electrical conductivity of polysilicon electrode material, particularly for interline CCDs, which are well known in the art to have a lesser amount of polysilicon in the regions of the sensors occupied by the photodiodes. This problem can in principal be solved by connecting together similarly clocked phases by means of an external conductive material or "strap", as disclosed by T. Nobusada, et al. "A Frame Interline Transfer CCD Image Sensor for HDTV Camera System", ISSCC Digest of Technical Papers, pp. 88–89, February, 1989, who described a device made with overlapping polysilicon electrodes and with strapping of metallic titanium which served additionally to keep unwanted light from penetrating the CCD shift registers. A similar technology, serving additionally to shield against unwanted light, is disclosed in U.S. Pat. No. 5,399,888. However, the topography of all the devices cited, including that disclosed by Nobusada, makes fabricating electrical connections difficult and reduces yield. In addition, the topography of the cited devices makes it difficult for the highly conducting material to act as a light shield for keeping unwanted light from penetrating the CCD shift registers, due to reflections and light piping. In the device taught in U.S. Pat. No. 3,911,560, no attempt was made to increase conductivity by connecting adjacent or nearby CCD phases by means of a highly conducting material.

Hawkins and Nielsen in U.S. application Ser. No. 08/376, 994 cited above, teach a method of making a planar CCD in which implants are made directly into a substrate or into a thin dielectric layer, thereby avoiding potential wells and barriers. Although this device does not suffer from implantation misalignment, high speed charge transfer efficiency is still limited for large numbers of pixels by the electrical conductivity of polysilicon electrode material, particularly for interline CCDs. No attempt was made in the device taught in U.S. application Ser. No. 08/376,994 cited above to increase conductivity by connecting adjacent or nearby CCD phases by means of a highly conductive material nor to shield the CCD shift registers from unwanted light.

SUMMARY OF THE INVENTION

It is an object of this invention to provide an improved method of making a two phase CCD device.

It is a further object of this invention to provide improved electrical conductivity between similarly docked CCD phases.

It is a still further object of this invention to provide improved control of unwanted light in CCD shift registers.

These objects are achieved in a method of making, on a semiconductive substrate, a planar CCD in which the formation of closely spaced conductive electrodes is accomplished by uniform planarization of a second conductive layer uniformly deposited over closely spaced strips of a first conductive layer, the steps comprising:

(a) uniformly implanting, in a semiconductive substrate of the first conductivity type, impurity ions of the second conductivity type to form a buried channel region beneath the surface of the semiconductive substrate;

(b) patterning, in the form of closely spaced first conductive strips, a first conductive layer on a dielectric layer uniformly overlying the semiconductive substrate;

(c) uniformly implanting impurity ions of the first or second conductivity type into the semiconductive substrate, the implant blocked in regions covered by the first conductive strips;

(d) providing an insulative region over the exposed first conductive strips;

(e) uniformly depositing a second conductive layer;

(f) uniformly planarizing the entire deposited second conductive layer to remove the layer from regions in which it overlaps the first conductive strips at least to the extent that the second conductive layer is patterned in electrically isolated second conductive strips as a result;

(g) uniformly forming a thick insulative layer;

(h) etching contact holes in the thick insulative layer at alternate regions where the first and second conductive strips are adjacent and exposing the surfaces of the first and second conductive strips and of the insulative region;

(i) depositing a first metallic conductive material at least filling the contact holes;

(j) planarizing the first metallic conductive material at least to the extent that is removed from the surface of the thick insulative layer;

(k) partially removing the remaining first metallic conductive material in selected contact holes to the extent that the top of the remaining first metallic conductive material in the selected contact holes lies substantially below the top surface of the thick insulative layer;

(l) depositing a plug insulative layer in the portions of the contact holes not occupied by the first metallic conductive material;

(m) uniformly planarizing the plug insulative layer to remove it from the thick insulative layer and from regions over contact holes not selected for partial removal of the first metallic conductive material; and (n) depositing a second metallic conductive material in electrical contact with those regions of the first metallic conductive material not selected for partial removal.

This method advantageously provides self-alignment of edges of charge transfer direction biasing implants to all gate electrodes without requiring implantation of impurity ions through gate electrodes.

It is a related advantage that CCDs constructed in accordance with this invention have substantially reduced charge transfer "wells" and "barriers" produced by misalignments and by lateral spread of charge transfer direction biasing implants. As a result, a method is provided for making CCDs with increased charge transfer efficiency.

It is also a related advantage that CCDs constructed in accordance with this invention have transfer and storage regions of both phases which are identical and which are defined by a single mask level, thereby not depending on mask to mask alignment tolerances, well known in the art to reduce the charge capacity of CCDs.

A feature of this invention is that either the transfer or the storage electrodes may be deposited first, there being no overlapping structure of the second conductive electrode strips to contend for space over the first strips. It is a related advantage that CCDs constructed in accordance with this invention have transfer regions not subject to the need for implantation other than the initial implantation of the first conductivity type. Also, the method enables the use of charge transfer direction biasing implants of either conductivity type.

Another advantage of this method is that the process provides a simple and planar means of electrically connecting laterally adjacent gate electrodes both with one another and with other similarly clocked pairs of gate electrodes, the electrical connections between electrodes and pairs of electrodes being made in a minimum of space and with materials of substantially higher conductance than the material of the gate electrodes, which is advantageous for high speed operation. Devices made in accordance with this invention exhibit enhanced planarity, which is generally acknowledged to be advantageous in semiconductor device fabrication.

Another advantage of this method is that a light shield is formed that is fully planar to the surfaces of the gate electrodes providing a process less subject to the scattering of light from irregular surfaces and less subject to process variations.

The method described is particularly suited to the construction of interline transfer two phase CCDs but can also be applied equally to the fabrication of other types of CCD structures benefiting from self-alignment of electrodes and implants and from implants of low lateral spread, such as charge transfer speed-up implants well know in the art of three and four phase CCDs.

Other advantageous features will become apparent upon reference to the following "Description of the Preferred Embodiments", read in light of the attached drawings.

DESCRIPTION OF THE PREFERRED EMBODIMENTS

Much of the following discussion concerns the construction of a two-phase CCD using polysilicon electrodes. While particularly suited to this device, the present invention is in addition applicable to any device in which an implant is desired formed below and self-aligned to a conductive electrode or a portion of a conductive electrode without the necessity of implantation through the electrode or any part of the electrode. The term "self-aligned" is taken to mean that accurate alignment of two physical structures is not dependent on accurate alignment of a mask. The invention is useful in any situation where extent of the implanted dopant under one or more clocked phases is determined by a single mask and is not dependent on mask to mask alignment. The term "polysilicon" is used to mean a conductive electrode material formed from polysilicon which may be heavily doped either during or after deposition to enhance its conductivity by impurity ions such as phosphorous, arsenic, or boron.

The method of the present invention for constructing two phase CCDs exhibiting accurate alignment of implanted dopants and conductive electrodes is illustrated by reference to FIGS. 2A through 2M. A semiconductive substrate 10, most preferably P type single crystal silicon, having a buried n-type channel (not shown) to contain minority carrier charge (electrons), has overall a first insulative layer 14, preferably a grown layer of silicon dioxide (oxide), and a second insulative layer 16, preferably of deposited silicon nitride (nitride), the insulative layers together comprising a dielectric 20. Preferably, the thickness of dielectric 20 is in the range 100 to 1000 Angstrom units, the thickness of the oxide being greater than that of the nitride as is known in the state of the art of dielectric insulators. Deposited on dielectric 20 is a first conductive layer 30, preferably polysilicon, whose properties are such that nearly vertical walls can be formed by dry etching, the pattern being defined by conventional photoresist (not shown), and having a thickness sufficient to block ion implants otherwise directed into the silicon substrate, and also at least as thick as the desired thickness of the conductive electrodes later to be formed. Such thicknesses preferably lie in the range of from several tenths of a micron to several microns, the thicker values appropriate for blocking very high energy implants, for example implants in the range of from 200 KeV to 2 MeV. It is also desired that the layer be capable of forming an electrically insulative region on its surface upon oxidation.

Figure 2A:
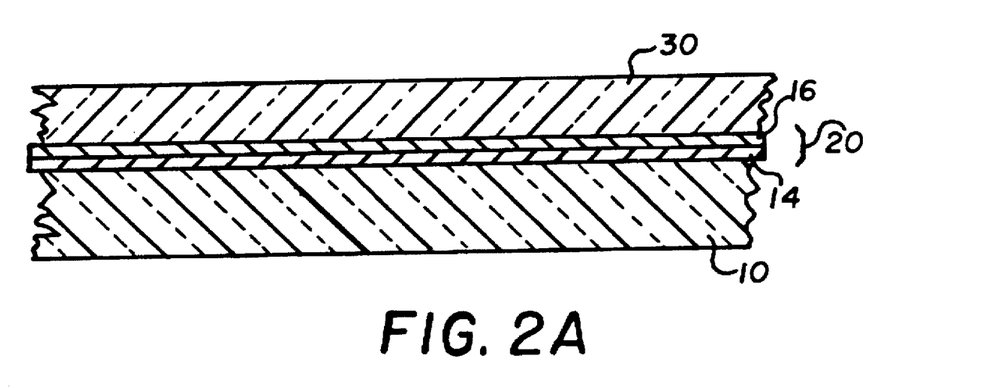
FIGS. 2A through 2M are partially schematic vertical section views through a semiconductor device illustrating respectively the successive steps of one preferred embodiment of this invention.
Figure 2B:
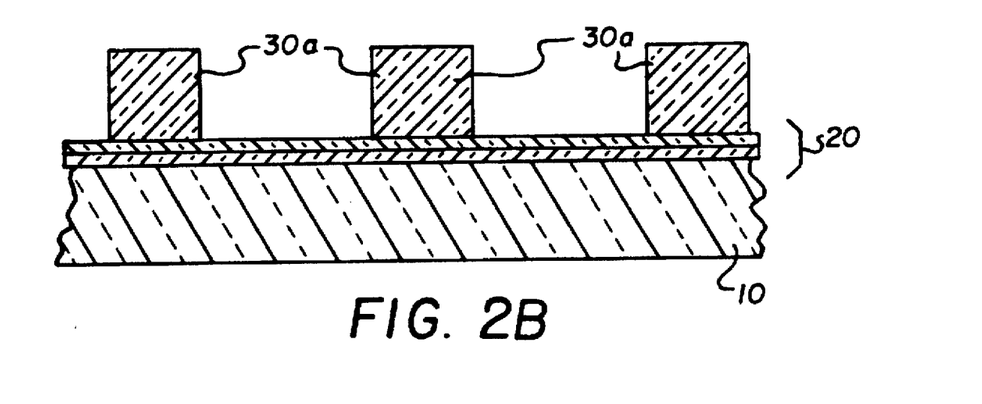

FIG. 2B shows the structure of FIG. 2A after definition of first conductive layer 30 to form closely spaced conductive strips 30a by dry etching, for example, by anisotropic reactive ion etching, know in the art to form vertical sidewalls. The photoresist has been removed in FIG. 2B. The walls of the resulting conductive strips will be utilized in accordance with this invention to define the edges of the charge transfer direction biasing implants and to define the location of the sides of the subsequently formed second conductive strips, as will be described. The ability to make this wall vertical is thus a key feature in the present invention.

Figure 2C:
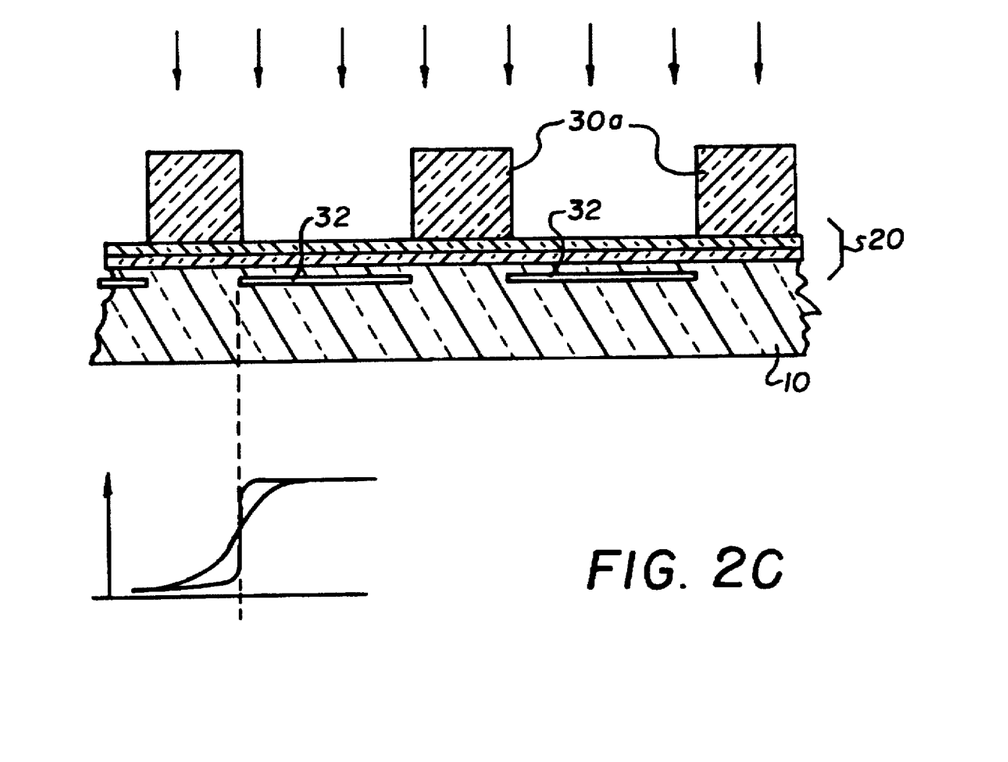

FIG. 2C shows one preferred embodiment in which an implant (arrows) of the second conduct type, preferably arsenic, is used to form the storage region of the first CCD phase. The location of the As implant 32 is shown in FIG. 2C. The spreading of the implant laterally in accordance with this invention is small in comparison to the prior art taught in accordance with U.S. Pat. Nos. 3,927,468; 4,613,402; and 4,746,622, because the energy required to penetrate the dielectric 20 is much less than that required to penetrate the conductive electrodes and the dielectric layers taught in the patents referred to above. This is shown schematically by the implant profile graph under FIG. 2C, which depicts the implant concentration (vertical axis) as a function of position near the electrode edge for prior art, technologies (spread-out curve) taught in accordance with U.S. Pat. Nos. 3,927,468; 4,613,402; and 4,746,622, and for the current invention (abrupt curve).

Figure 2D:
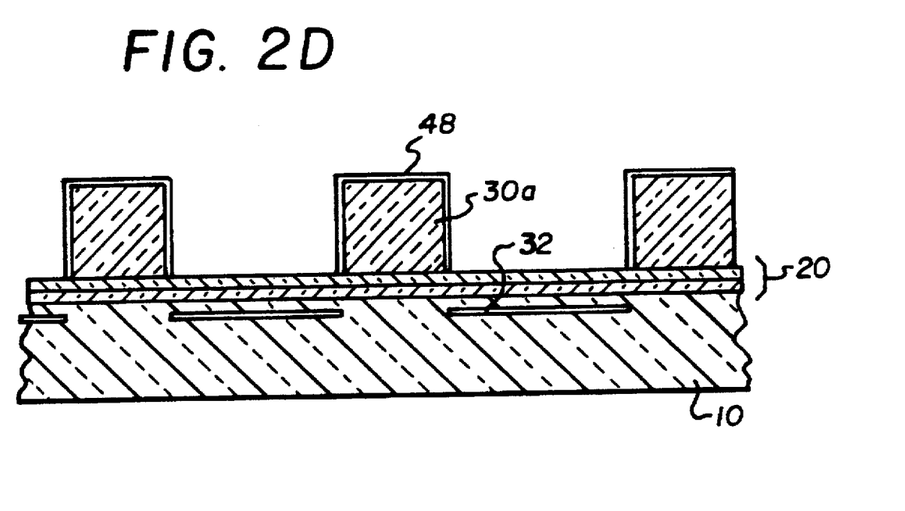

At this stage, both of the two charge transfer direction biasing implants (Phase I and Phase II) have been formed. FIG. 2D shows the device cross-section following formation of insulative region 48, preferably grown silicon dioxide. In one preferred embodiment, this insulative region is grown at low temperatures to ensure minimal dopant diffusion. In the case of the preferred bias implant being arsenic, diffusion is essentially negligible for temperatures below 900° C. The oxide is grown thin, typically in the range of from 200 to 1000 Angstroms, so that the first conductive strips will be closely spaced to second conductive strips to be formed. It is advantageous that the grown oxide extends into and out of the edges of the first conductive strips in similar thicknesses, maintaining thereby a central location of the edge of the implant in substrate 10 with respect to the center of the insulative region 48. It is also advantageous that the thickness of this oxide can be adjusted and the order of its growth with respect to ion implantation altered in order to precisely establish the placement of the implant with respect to the edges of the first conductive strips.

Figure 2E:
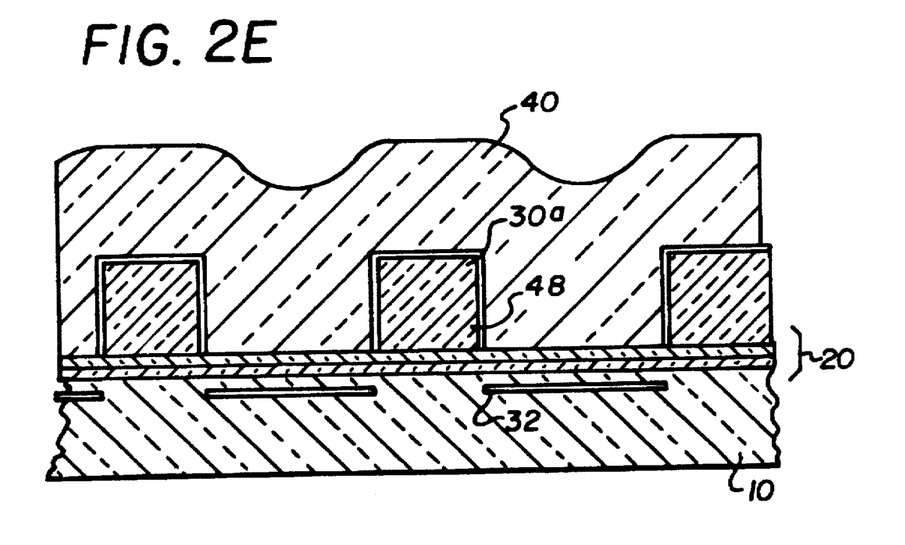

Formation of second conductive strips is next accomplished in a preferred embodiment shown in FIG. 2E, in which a second conductive layer 40 preferably heavily doped polysilicon, has been deposited, preferably by chemical vapor deposition, as is common in the art. The thickness of this layer is chosen advantageously to be about the same thickness as the first conductive layer. The preferred range of polysilicon thickness is typically from 0.1 micron to 1.0 micron for the preferred case of arsenic implantation. However, in some applications of the present invention, a later need to block more penetrating ion implantations, used for example to establish photodiodes along side the CCD shift registers, may dictate the use of thicker conductive layers.

Figure 2F:
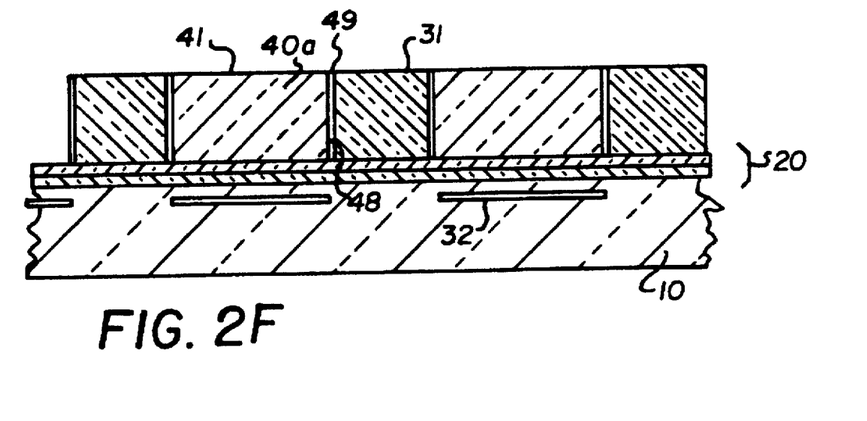

It now remains to pattern second conductive layer 40 into second conductive strips 40a in order to establish closely spaced, electrically isolated first and second conductive strips, 30a and 40a respectively. This is advantageously accomplished in one preferred embodiment by subjecting the surface of the wafer of FIG. 2E to chemical mechanical polishing (CMP), as currently practiced in the semiconductor art for the planarization of metals and dielectrics and as taught in numerous U.S. Patents such as that by Chow et al., U.S. Pat. No. 4,789,648, and by Carr et al., U.S. Pat. No. 4,954,142. This procedure, while being only one of many possible planarizing procedures, is advantageous in its ability to render the surface extraordinarily smooth, improving the ability to subsequently grow insulative oxide layers on the top regions of the first and second conductive strips. It is advantageous to planarize this layer so as to remove it entirely from regions over the first conductive electrode strips, thereby defining electrically isolated second conductive strips. The slurry for this procedure is preferably fumed silica in KOH at a pH of about 10, so that the removal rate of polysilicon is about the same as that of oxide in order that the final polished surface comprises conductive strips of rectangular cross sections with nearly flat upper surfaces, as shown in FIG. 2F. Many other slurries are possible as practiced currently in the industry, such as slurries with larger chemical etch rates for polysilicon than for oxide, thus enabling etch stops (not shown) to be incorporated into the process to provide endpoint control. A critical feature of the current invention is preservation of the integrity of the gate dielectric directly underneath the conductive electrode during chemical mechanical polishing, a feature not generally required or obtained in the CCD art. The results of chemical mechanical polishing are shown in FIG. 2F. The surfaces 31 and 41 of first conductive electrode strips 30a and of second conductive electrode strips 40a and of the surfaces 49 of insulative region 48 are preferably coplanar to within 100 Angstroms, although the process is tolerant of lesser coplanarity.

Figure 2G:
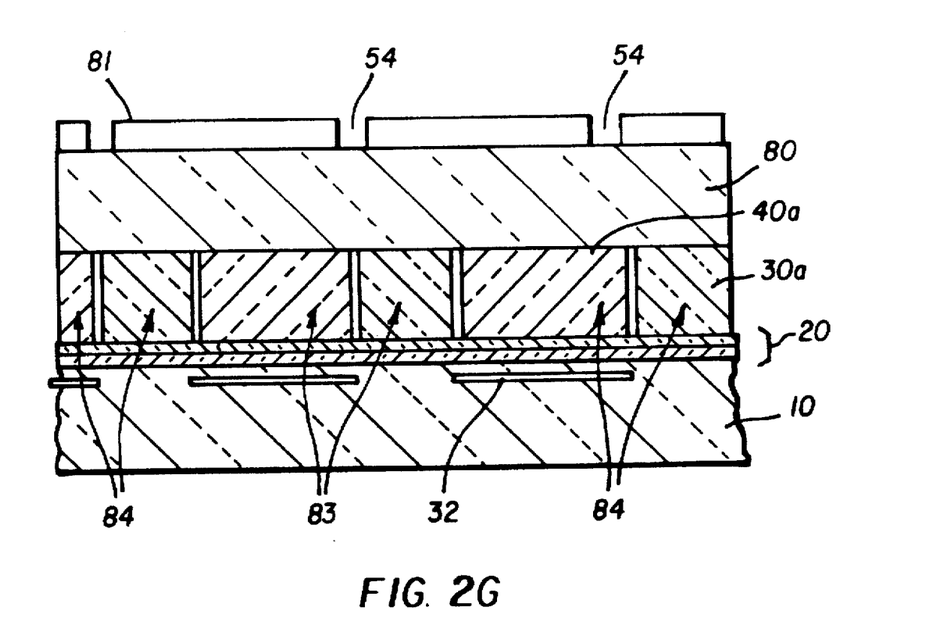

At this stage of the process the conductive electrode strips are electrically isolated. It is now desired to connect strips pairwise to form composite first and second conductive electrodes 83 and 84 of FIG. 2G, each of which is comprised of a first conductive strip 30a and a second conductive strip 40a, the charge transfer direction biasing implant lying under only one conductive strip of the composite electrode and to simultaneously connect alternate pairs of first and second conductive strips 30a and 40a together with materials substantially more conductive than the material, preferentially doped polysilicon, which comprises the first and second conductive strips. This is preferentially accomplished by the steps of first depositing a thick insulative layer 80, FIG. 2G, preferentially of oxynitride, which may be etched by dry etching processes without etching appreciably the layers 30a, 40a, and 48 on which layer 80 is deposited, the thickness preferentially lying in the range of from 0.1 to 1.0 microns in order that conductive materials subsequently deposited on the surface of thick insulative layer 80 not be in close proximity to the surfaces 31 and 41 of the first and second conductive strips, which are clocked at different potentials, as is well known in the art, in order to minimize capacitive coupling. The deposition of thick insulative layer 80 is shown in FIG. 2G, which in addition depicts deposition and patterning of photoresist layer 81, defined to provide contact holes 82 (FIG. 2H) to the regions 54 (FIG. 2G) between alternate pairs of the underlying first and second conductive strips. As shown in FIG. 2G, the location of the openings in photoresist 81 is unusual for contact openings in that the openings are deliberately positioned to lie directly over both surfaces 31 and 41 of juxtaposed first and second conductive strips 30a and 40a and surface 49 of insulative material 48, as is shown in more detail in the enlarged view of FIG. 2H.

Figure 2H:
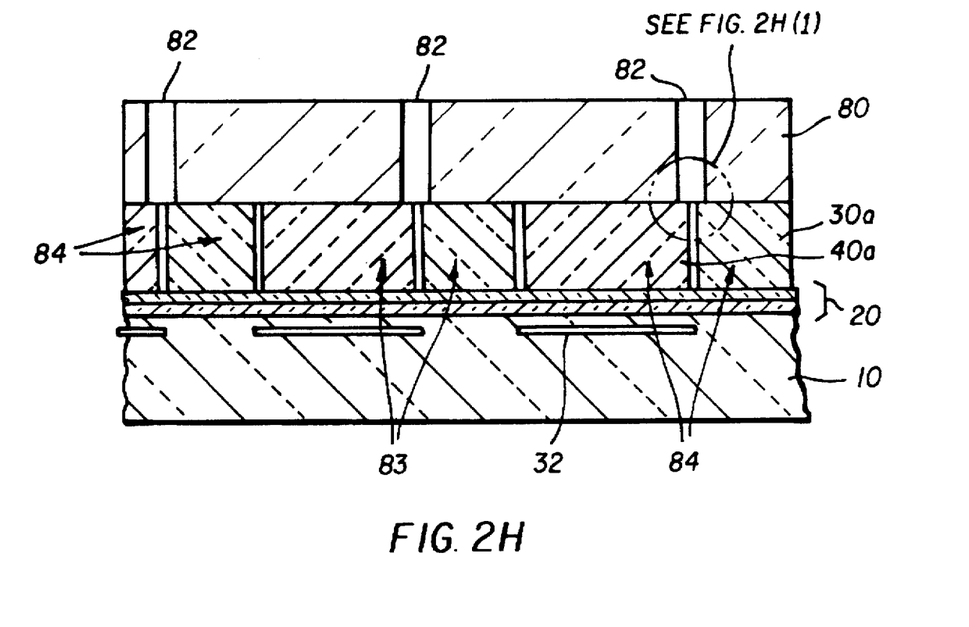

The device so patterned is next subjected to an anisotropic contact etch, for example an etch using gases such as $CHF_3$, oxygen, and $SF_6$, of thick insulative layer 80, the etch stopping on surfaces 41, 31, and 49 as shown in FIG. 2H and in the enlarged view of a portion of FIG. 2H. The result of this etch, as shown in FIG. 2H, is to simultaneously expose surfaces 41, 31, and 49 so as to provide the ability to directly connect electrically pairs of first and second conductive strips 30a and 40a to form first and second composite gate electrodes 83 and 84 while simultaneously providing the ability to electrically connect selected first and second composite gate electrodes 83 and 84 in a minimum of space.

Figure 2I:
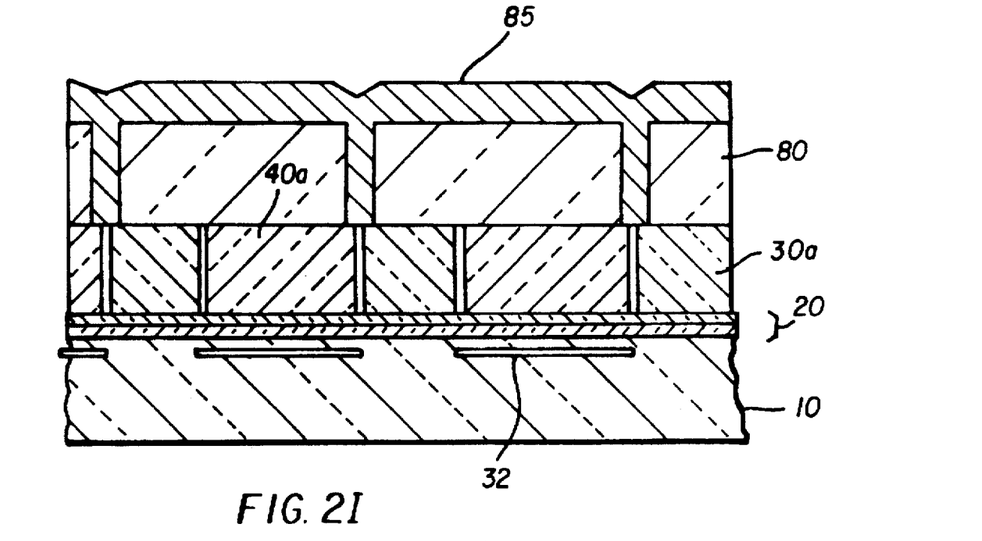
Figure 2J:
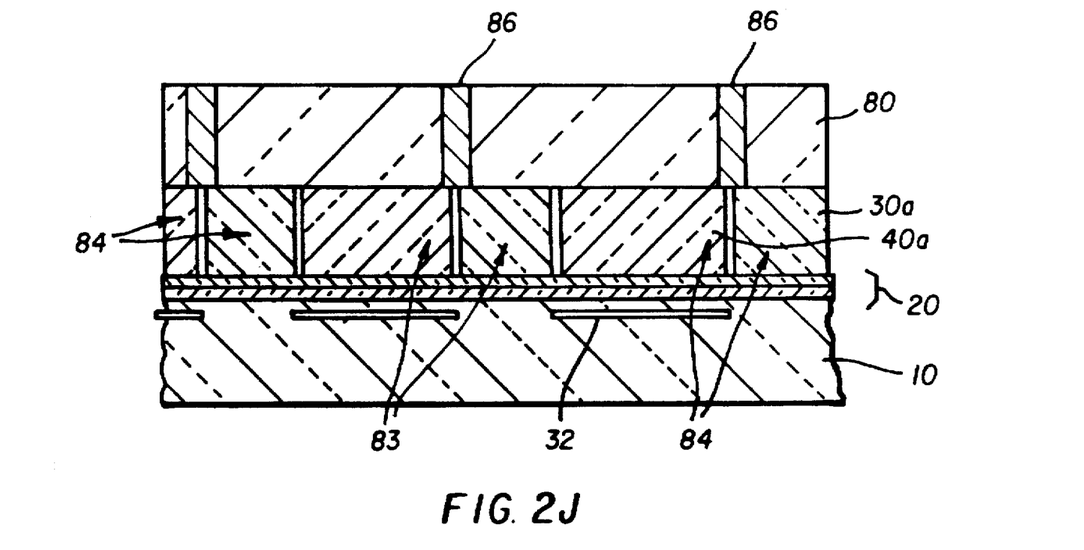

To accomplish these connections, it is now desired to fill contact holes 82 with a first metallic conductive material 85 having a conductance substantially greater than that provided by the pixel to pixel conductance of the polysilicon electrodes. Such a material is preferentially aluminum, deposited in a manner, for example at a high temperature, such that the aluminum fills the contact holes 82, and overlies the entire top surface of thick insulative layer 80. This step is shown in FIG. 2I, just prior to planarization of first metallic conductive material 85. The result of planarization, preferably by chemical mechanical polishing, is depicted in FIG. 2J, where planarization is at least sufficient to remove the material from the surface of thick insulative layer 80 forming metallic plugs 86. While such planarization is preferentially accomplished by chemical mechanical polishing, many alternative techniques such as deposition and etchback are well known in the art. At this stage of fabrication, alternate pairs of first and second conductive strips 30a and 40a are now electrically connected to form first and second composite gate electrodes 83 and 84 in a minimum of space.

Figure 2K:
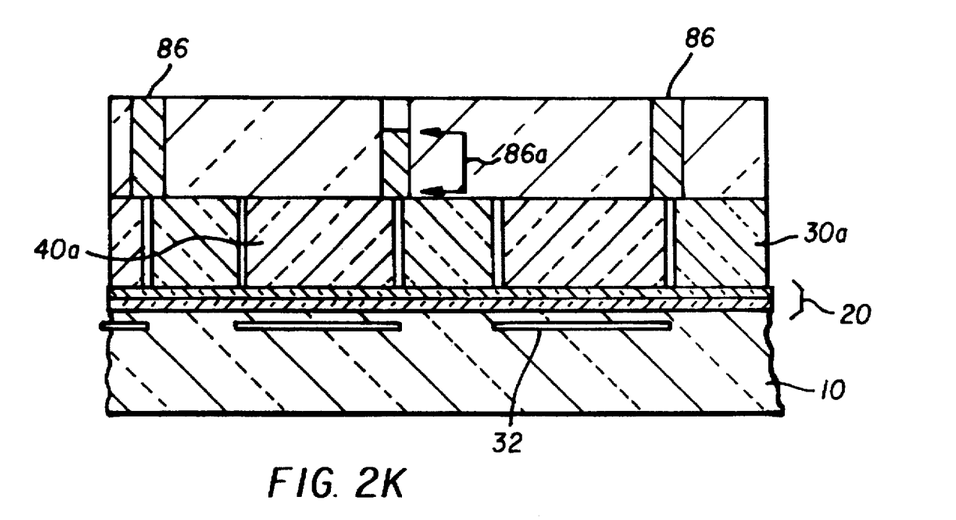

It is next desired to remove a portion, preferentially about half, of the first metallic conductive material from every other metallic plug 86. This may be accomplished by first masking, using conventional photolithographic techniques, every other contact hole and preferentially etching a portion of the first metallic conductive material using a timed dry etch, for example, a chlorine containing etch in the case that first metallic conductive material 85 is aluminum. The result of such an etch is depicted in FIG. 2K, in which about half of the total thickness of first metallic conductive material 85 has been removed from every other contact hole to form partial metallic plugs 86a of FIG. 2K.

The structure is now subjected to deposition of a plug insulative material 87, preferably an oxide deposited conformally by chemical vapor deposition, so as to at least fill the holes above partial metallic plugs 86a at least to the level of thick insulative layer 80. The plug insulative material is then removed preferentially, again by chemical mechanical polishing, from the surface of thick insulative layer 80 and metallic plugs 86 so as to form a resulting composite plug 86b that is substantially coplanar with the top surface of thick insulative layer 80 along its entire surface, as shown in FIG. 2L.

Figure 2L:
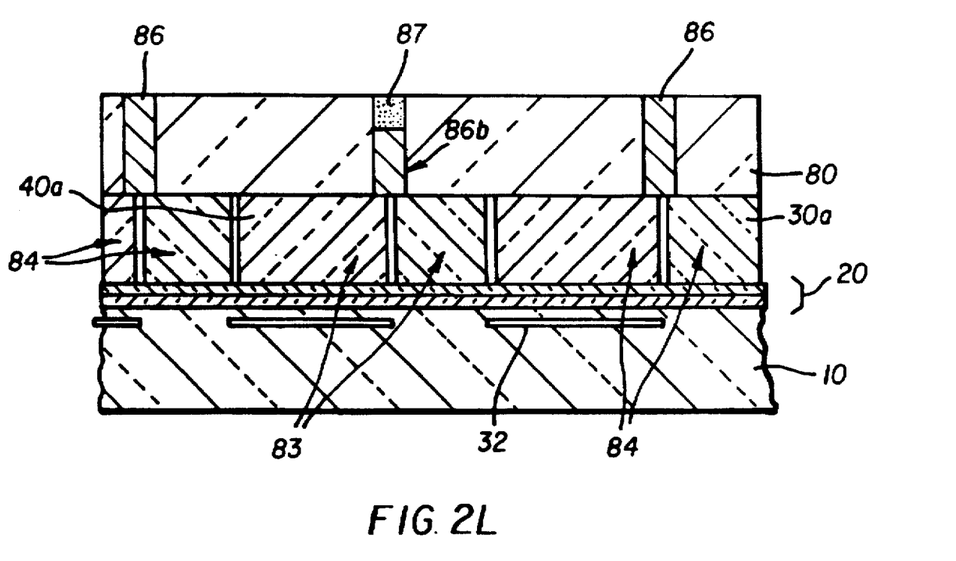
Figure 2M:
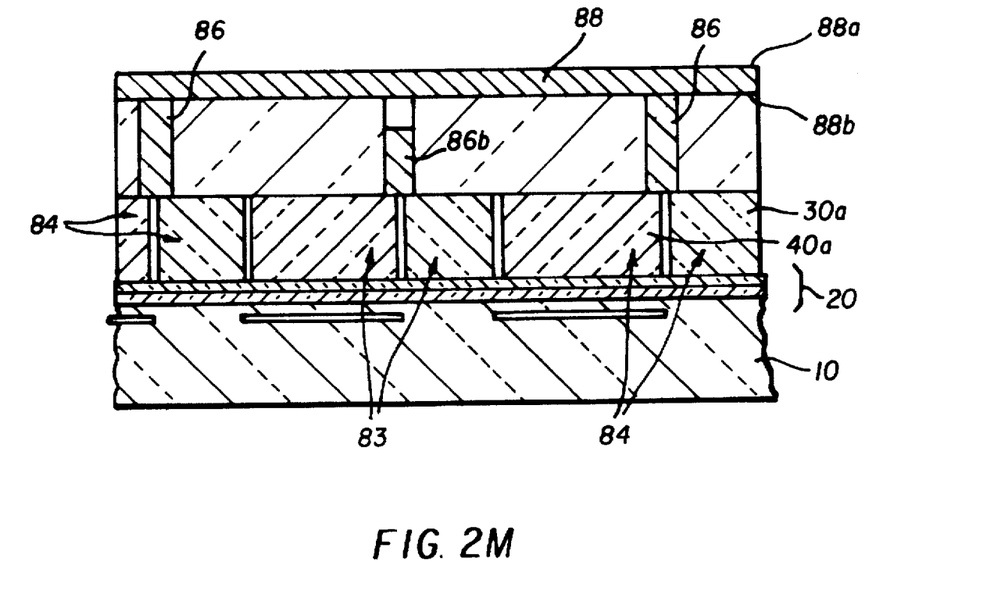

The device structure is now nearly complete, the remaining task being to form a second metallic conductive material 88 which is planar to planar surfaces 31 and 41 with top and bottom surfaces 88a and 88b respectively, on top of the surfaces of the thick insulative material 80, metallic plugs 86, and composite plugs 86b in FIG. 2L. The formation of the second metallic conductive material 88, as shown in FIG. 2M, preferably by sputtering of aluminum, results in the connection of alternate pairs of connected first and second conductive strips to one another. FIG. 2M shows a structure in which first and second conductive strips 30a and 40a are connected electrically in pairs so as to form composite first and second gate electrodes 83 and 84 respectively and in which either the first or the second (second as shown) gate electrodes are themselves connected electrically. The connection between adjacent first and second conductive strips is the most direct and has therefore the least electrical resistance compared to the connection between composite gate electrodes.

According to this embodiment, the top surface 88a and bottom surface 88b of second metallic conductive layer 88 are coplanar to the planar structure formed by the surfaces 31 and 41 of the first and second conductive strips 30a and 40a. Preferably, second metallic conductive layer 88 is thicker than about 1000 Angstroms to reduce optical transmission.

At this point the device is substantially complete, save for conventional passivation, contact openings, and other metal electrode deposition and patterning steps, which are unrelated and not specific to the scope of this invention, but which need be performed to complete the device in the same manner as in the completion of any two phase CCD.

It is to be appreciated that while the preferred embodiment has been described, there are many variants of the method of this invention applicable to a variety of device materials which may be employed within the scope of this invention to optimize device functionality in specific applications.

In a second preferred embodiment, the thick insulative layer 80 is a polyimide, thereby reducing the capacitive coupling between the second metallic conductive material and the first and second conductive strips, as is well known in the art, and permitting the use of a highly selective etch, such as an RIE oxygen based etch, for forming the contact holes.

In another preferred embodiment, the contact etch may etch differently to some degree the surfaces of the first and second conductive strips versus the surface 49 of the insulative region 48. In accordance with this embodiment, the insulative region 48 may be etched a small amount, preferably less than 0.1 micron, provided the first metallic conductive material 85 is deposited so as to fill completely the contact holes 82.

In another preferred embodiment, the first metallic conductive material 85 is tungsten or tungsten silicide while the second metallic conductive material 88 is aluminum or an aluminum alloy. In still another preferred embodiment, the second metallic conductive material 88 is also tungsten or tungsten silicide. In still another embodiment the first and second conductive materials are copper.

In another preferred embodiment, the first metallic conductive material is deposited as a bilayer, the first layer of which is a diffusion barrier such as titanium nitride and the second layer of which is a metal such as aluminum or aluminum alloy as is well known in the art.

In another preferred embodiment, the first metallic conductive material 85 is tungsten or tungsten silicide and is deposited in the contact holes 82 by selective deposition, thereby rendering unnecessary the removal of this material from the surface of the thick insulative layer 80, as is well known to the semiconductor processing art.

The material comprising the insulative region 48 while preferably a grown oxide may also be a deposited material, for example a nitride or a deposited oxide, or a bilayer of oxide and nitride, which reduces thermal processing.

The materials comprising the first conductive layer 30 and second conductive layer 40 while preferably doped polysilicon can in some applications be advantageously chosen to be a transparent conductor, such as indium tin oxide or tin oxide, known in the art to provide better transmission of light to the substrate, as is appropriate when the CCD is photoactive, as in the case of a full frame image sensor.

Dielectric 20 in FIG. 2A may also be comprised of other dielectric layers. A more complex dielectric layer is comprised of a four layer stack, from bottom to top, an oxide layer, nitride layer, oxide layer, and nitride layer, chosen to reduce the effects of charge injection from the conductive electrodes into the dielectric layers as is known in the art. Preferred in this embodiment are layer thicknesses for each of the bottom three layers of from 50 to 300 Angstroms each and less than 200 Angstroms for the top layer, the bottom layer having been thermally grown, the upper layers having been deposited by standard techniques of chemical vapor deposition.

A related material choice for dielectric layer 120 is a three layer stack, from bottom to top, of oxide, nitride, and oxide. Preferred in this embodiment are layer thicknesses for each of the three layers of from 50 to 300 Angstroms each, the bottom layer having been thermally grown, the middle and top layers having been deposited by standard techniques of chemical vapor deposition. Another preferred choice for the dielectric layer 120 is thermally grown oxide, preferably in the thickness range 100 to 1000 Angstroms. A related material choice for the third plug insulative material 87 is silicon nitride, preferably deposited by plasma enhanced chemical vapor deposition in order that the processing temperature remain below 400° C. A related material choice for the thick insulative layer 80 is a material having a low dielectric constant such as a fluorinated oxide or a polyimide.

While the preferred embodiment has been described in cross-section along the direction of charge transfer of a two phase CCD shift register, the method in accordance with this invention may be advantageously applied to patterning the CCD in a direction substantially perpendicular to the direction of charge transfer as well. Such patterning is particularly useful, for example, in defining the CCD shift registers of interline transfer CCDs, in which case space must be allowed between shift registers for independent photoreceptors, as is well known in the art.

It is to be appreciated that the steps for making the CCD have been described from the point of view of a cross-section running along a CCD shift register and do not reflect the detailed features of a plan view of a particular type of image sensor made using this technology. The particular choices for device design in plan view are immaterial to the present invention and are well known in the art. For example, in fabricating interline sensor arrays, CCD shift registers run in vertical columns; and, as has been long been common practice, different columns of CCDs may make common contact to independent regions of an overlying metallic conductive material, not to a single sheet of metallic conductive material covering the entire sensor. Also, as is commonly practiced, the point along the CCD at which contact to the overlying metallic conductive material is made differs for different CCD columns so that the contact points appear from a plan view not to be horizontally aligned but rather staggered a geometry disclosed in relation to a different fabrication method in the previously cited paper by Nobusada, et al.

Also, unique two phase CCD structures made possible by the present invention include structures in which the independent electrical control of a small number of storage and transfer regions is rendered possible by omission of the connection between adjacent conductive electrode strips that would, in accordance with this invention, ordinarily form a single phase, and by then clocking each of the conductive strips independently.

Another advantageous application, relating to the type of charge transfer direction biasing implants used in accordance with this invention, is achieved by choosing the charge transfer direction biasing implant to be of the first conductivity type. In this case, the charge transfer direction biasing implant acts as a CCD transfer region rather than as a storage region, and is advantageously chosen to be shorter than the remaining portion of the electrode phase. It is thus a feature of this technology that implantation in either storage or transfer regions is equally accommodated. It is to be appreciated that the possibility of all such combinations derives from the fact that in accordance with this invention the connection of adjacent electrodes requires minimal space in comparison with devices previously taught, for example by Amelio et al. in U.S. Pat. No. 3,911,560. A related feature of this invention is the combination of the connection of adjacent electrodes with an overlying planar metallic layer, advantageous in preventing unwanted light from penetrating into CCDs shift registers.

The invention has been described in detail with particular reference to preferred embodiments thereof, but it will be understood that variations and modifications can be effected within the spirit and scope of the invention.

PARTS LIST 10 semiconductive substrate
14 first insulative layer
16 second insulative layer
20 dielectric
30 first conductive layer
30a first conductive strips
31 surface
32 implant
40 second conductive layer
40a second conductive strips
41 surface
48 insulative region
49 surfaces
54 regions
80 thick insulative layer
81 photoresist layer
82 contact holes
83 composite first gate electrode
84 composite second gate electrode
85 first metallic conductive material
86 metallic plug
86a partial metallic plug
86b composite plug
87 plug insulative material
88 second metallic conductive material
88a top surface
88b bottom surface

What is claimed is:

1. A method of making, on a semiconductive substrate, a planar CCD in which the formation of conductive electrodes is accomplished by uniform planarization of a second conductive layer deposited over strips of a first conductive layer, the steps comprising:
   (a) implanting, in said semiconductive substrate of the first conductivity type, impurity ions of the second conductivity type to form a buried channel region beneath the surface of the semiconductive substrate;
   (b) patterning, in the form of first conductive strips, said first conductive layer on a dielectric layer overlying the semiconductive substrate;
   (c) implanting impurity ions of the first conductivity type into the semiconductive substrate, ion implanting being blocked in regions covered by the first conductive strips;
   (d) providing an insulative region over the first conductive strips;
   (e) depositing said second conductive layer;
   (f) planarizing the second conductive layer to remove the second conductive layer from regions in which said second conductive layer overlaps the first conductive strips at least to the extent that the second conductive layer is patterned in electrically isolated second conductive strips;
   (g) forming an insulative layer;
   (h) etching contact holes in the insulative layer at alternate regions where the first and second conductive strips are adjacent to expose the surfaces of the first and second conductive strips and of the insulative region;
   (i) depositing a first metallic conductive material at least filling the contact holes;
   (j) planarizing the first metallic conductive material at least to the extent that said first metallic conductive material is removed from the surface of the insulative layer;
   (k) partially removing the remaining first metallic conductive material in predetermined contact holes to the extent that the top of the remaining first metallic conductive material in the predetermined contact holes lies below the top surface of the insulative layer;
   (l) depositing a plug insulative layer in the portions of the contact holes not occupied by the first metallic conductive material;
   (m) planarizing the plug insulative layer to remove said plug insulative layer from the insulative layer and from regions over said contact holes which were not subject to partial removal of the first metallic conductive material; and
   (n) depositing a second metallic conductive material in electrical contact with those regions of the first metallic conductive material not selected for partial removal.

2. The invention of claim 1 wherein the planarizing step is accomplished by chemical mechanical polishing.

3. The invention of claim 1 wherein the planarizing step is accomplished by deposition and etchback.

4. The invention of claim 1 in which the first and second conductive layers are polysilicon and the dielectric layer includes a bilayer of thermal oxide on which is deposited silicon nitride.

5. The invention of claim 1 in which the first and second metallic conductive materials are aluminum.

6. The invention of claim 1 in which the first and second metallic conductive materials are selected from the group comprising tungsten, tungsten silicide, titanium and titanium nitride.

7. In a CCD, a method of connecting electrically a first and second set of conductive strips separated by insulative regions, resulting in a planar structure, the method comprising:
   (a) planarizing a set of interleaved first and second conductive strips separated by a first insulative region at least to the extent that the surfaces of the first and second conductive strips and the planarized surface of the insulative layer are coplanar;
   (b) depositing an insulative layer;
   (c) etching contact holes in the insulative layer at regions where the first and second conductive strips are adjacent to expose said first metallic conductive material surfaces of the first and second conductive strips and of the first insulative layer;
   (d) depositing a first metallic conductive material at least filling the contact holes;
   (e) planarizing the first metallic conductive material at least to the extent that is removed from the surface of the insulative layer;
   (f) partially removing the remaining first metallic conductive material in predetermined contact holes to the extent that the top of the first metallic conductive material in the predetermined contact holes lies below the top surface of the second insulative layer;
   (g) depositing a plug insulative layer in the portions of the contact holes not occupied by the first metallic conductive material;
   (h) planarizing the plug insulative layer to remove said plug insulative layer from the insulative layer and from regions over contact holes which were not subject to partial removal of the first metallic conductive material; and
   (i) depositing a second metallic conductive material in electrical contact with those regions of the first metallic conductive material not selected for partial removal.

8. The method of claim 7 in which the strips are polysilicon.

9. The method of claim 7 in which the conductive strips are planarized by chemical mechanical polishing.

10. The method of claim 7 in which the first metallic conductive material and the plug insulative material are planarized by chemical mechanical polishing.

11. The method of claim 7 in which the first and second metallic conductive material is aluminum or an aluminum alloy.

12. The method of claim 7 in which the first and second metallic conductive materials are selected from the group comprising tungsten, tungsten silicide, titanium, and titanium silicide.

13. A method of fabricating, at a region of first conductivity type in a semiconductor substrate, a planar, two phase charge coupled device with charge transfer direction biasing implants accomplished simultaneously and identically for each phase, the geometry of each phase being defined by a single mask level, the implants underlying and self-aligned to electrically connected planar first and second conductive strips, alternate pairs of which are connected by planar metallization, the steps comprising:
   (a) forming a dielectric layer overlying said semiconductive layer of said first conductivity type;
   (b) implanting in the semiconductive substrate impurity ions of the second conductivity type;
   (c) patterning, in the form of identically sized, first conductive strips, a first conductive layer on the dielectric layer;

(d) implanting impurity ions of the first or second conductivity type into the semiconductive substrate, the implant blocked in regions covered by the first conductive strips;

(e) providing a first insulative layer over the first conductive strips;

(f) depositing a conductive layer;

(g) planarizing the second conductive layer to remove such conductive layer from regions when such conductive layer overlaps the first conductive strips at least to the extent that the second conductive layer is patterned in electrically isolated second conductive strips as a result;

(h) forming a second insulative layer;

(i) etching contact holes in the second insulative layer at alternate regions where the first and second conductive strips are adjacent and exposing the surfaces of the first and second conductive strips and of the first insulative layer;

(j) depositing a first metallic conductive material at least filling the contact holes;

(k) planarizing the first metallic conductive material at least to the extent that is removed from the surface of the insulative layer;

(l) partially removing the remaining first metallic conductive material in selected contact holes to the extent that the top of the conductive material in the selected contact holes lies below the top surface of the insulative layer;

(m) depositing a plug insulative layer in the portions of the contact holes not occupied by the first metallic conductive material;

(n) planarizing the plug insulative layer to remove it from the insulative layer and from regions over contact holes not selected for partial removal of the first metallic conductive material; and (o) depositing a second metallic conductive material in electrical contact with those regions of the first metallic conductive material not selected for partial removal.

14. The method of claim 13 in which the planarizing step is chemical mechanical polishing.

15. The method of claim 13 in which the planarizing step of the first metallic conductive material and the plug insulative layer is deposited and etchback.

* * * * *

UNITED STATES PATENT AND TRADEMARK OFFICE
CERTIFICATE OF CORRECTION

PATENT NO. : 5,719,075
DATED : February 17, 1998
INVENTOR(S) : Gilbert A. Hawkins, et al It is certified that error appears in the above-identified patent and that said Letters Patent is hereby corrected as shown below:

On the title page, insert item:

--[60] Provisional application No. 60/001,697 filed July 31, 1995--.

Column 1, line 9, under the heading "CROSS REFERENCE TO RELATED APPLICATIONS", insert the following:

Reference is made to and priority claimed from U.S. Provisional Application Ser. No. US 60/001,697, filed Jul. 31, 1995, entitled METHOD OF MAKING A PLANAR CHARGE COUPLED DEVICE WITH EDGE ALIGNED IMPLANTS AND ELECTRODES CONNECTED WITH OVERLYING METAL. --.

Signed and Sealed this

Twenty-sixth Day of January, 1999

Attest:

*Attesting Officer*   *Acting Commissioner of Patents and Trademarks*